United States Patent
Ye

(10) Patent No.: US 11,479,638 B2
(45) Date of Patent: Oct. 25, 2022

(54) PHOSPHORATED ANHYDRIDE CONTAINING EPOXY RESIN

(71) Applicant: BLUE CUBE IP LLC, St. Louis, MO (US)

(72) Inventor: Simon Ye, Shanghai (CN)

(73) Assignee: Blue Cube IP LLC, St. Louis, MO (US)

( * ) Notice: Subject to any disclaimer, the term of this patent is extended or adjusted under 35 U.S.C. 154(b) by 248 days.

(21) Appl. No.: 16/763,090

(22) PCT Filed: Nov. 9, 2017

(86) PCT No.: PCT/CN2017/110126
§ 371 (c)(1),
(2) Date: May 11, 2020

(87) PCT Pub. No.: WO2019/090563
PCT Pub. Date: May 16, 2019

(65) Prior Publication Data
US 2020/0291172 A1    Sep. 17, 2020

(51) Int. Cl.

| | | |
|---|---|---|
| *B32B 17/04* | (2006.01) |
| *C08G 59/42* | (2006.01) |
| *B32B 5/02* | (2006.01) |
| *B32B 15/092* | (2006.01) |
| *B32B 15/14* | (2006.01) |
| *B32B 15/20* | (2006.01) |
| *C07F 9/655* | (2006.01) |
| *C07F 9/6574* | (2006.01) |
| *H05K 1/03* | (2006.01) |
| *C08J 5/24* | (2006.01) |

(52) U.S. Cl.
CPC .............. *C08G 59/423* (2013.01); *B32B 5/02* (2013.01); *B32B 15/092* (2013.01); *B32B 15/14* (2013.01); *B32B 15/20* (2013.01); *B32B 17/04* (2013.01); *C07F 9/65517* (2013.01); *C07F 9/65744* (2013.01); *C08J 5/244* (2021.05); *H05K 1/0353* (2013.01); *B32B 2250/42* (2013.01); *B32B 2260/021* (2013.01); *B32B 2260/046* (2013.01); *B32B 2262/101* (2013.01); *B32B 2457/08* (2013.01); *C08J 2363/00* (2013.01)

(58) Field of Classification Search
CPC ....... B32B 15/092; B32B 15/14; B32B 15/20; B32B 17/04; B32B 2250/42; B32B 2260/021; B32B 2260/046; B32B 2262/101; B32B 2457/08; B32B 5/02; C07F 9/65517; C07F 9/6561; C07F 9/657172; C07F 9/65744; C07F 9/6584; C08G 59/423; C08J 2363/00; C08J 5/24; H05K 1/0353

See application file for complete search history.

(56) References Cited

U.S. PATENT DOCUMENTS

| | | |
|---|---|---|
| 5,500,285 A | 3/1996 | Carletti et al. |
| 2009/0118460 A1 | 5/2009 | Ravin et al. |
| 2015/0307648 A1 | 10/2015 | Komiya et al. |

FOREIGN PATENT DOCUMENTS

| | | |
|---|---|---|
| CN | 103965240 A | 8/2014 |
| CN | 106478968 A | 3/2017 |
| CN | 106750183 A | 5/2017 |
| JP | 2001181373 A | 7/2001 |
| JP | 2002069150 A | 3/2002 |
| JP | 2016006204 A | 1/2016 |
| WO | 2015066002 A1 | 5/2015 |

OTHER PUBLICATIONS

Yamana, K. et al. The Lewis Acid-Promoted Ractions of o-Pthalaldehyde with Trialkyl Phosphites: Formation of 1-Dialkoxyphosphorylisobenzofuran, Tetrahedron Letters, vol. 37. No. 33 (1996), pp. 5963-5966.
Decision of Rejection dated Mar. 29, 2022.

*Primary Examiner* — Lawrence D Ferguson
(74) *Attorney, Agent, or Firm* — Husch Blackwell LLP

(57) ABSTRACT

Disclosed herein are compounds of formulas (I) and (II), Wherein $R_1$, $R_2$, $R_3$ and (1) are as described herein. Methods of making compounds of formulas (I) and (II), curable compositions containing them and cured compositions containing them are also described. The compounds of formulas (I) and II are curing agents, fire retardants or both.

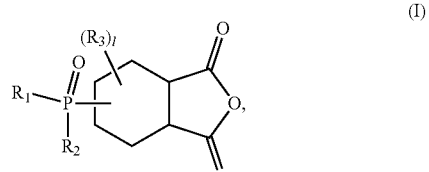

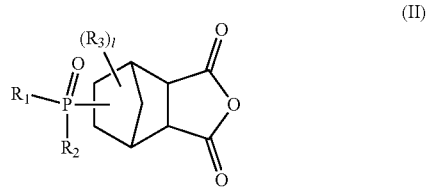

23 Claims, No Drawings

PHOSPHORATED ANHYDRIDE CONTAINING EPOXY RESIN

FIELD OF THE DISCLOSURE

The present disclosure relates generally to epoxy resins and in particular halogen-free, phosphorus-containing epoxy resins.

BACKGROUND

Epoxy resins are used in both industrial and consumer electronics because of, among other things, their chemical resistance, mechanical strength and electrical properties. For example, epoxy resins can be used in electronics as laminates, adhesive materials and/or insulating materials, such as interlayer insulating films. To be useful for these applications, the epoxy resins need to provide certain necessary physical, thermal, electrical insulation and moisture resistance properties. For example, it is advantageous for epoxy resins used for electric applications to have a high glass transition temperature ($T_g$).

Epoxy resins, however, can be flammable. As such, different approaches have been made to impart flame resistance to epoxy resins. Two main approaches have been taken to provide flame resistance. The first approach makes use of halogen compounds. Halogen-containing compounds have been commonly used in the electronic industry to impart flame resistance to electrical and electronic assemblies. For example, tetrabromobisphenol-A (TBBA) is a typical halogen-containing compound that has been widely used as a flame retardant for epoxy resins. Although halogen-containing compounds can be effective, they are considered by some to be undesirable from an environmental standpoint due to the possibility of formation hazardous substances during the incineration of electronic components at their end of life. The second approach, in a response to the environmental concerns of the first approach, is an "environmentally friendly" approach in which halogen-free compounds are used to impart flame retardancy.

BRIEF SUMMARY OF THE INVENTION

In a first aspect, disclosed herein are compounds of formulas I or II:

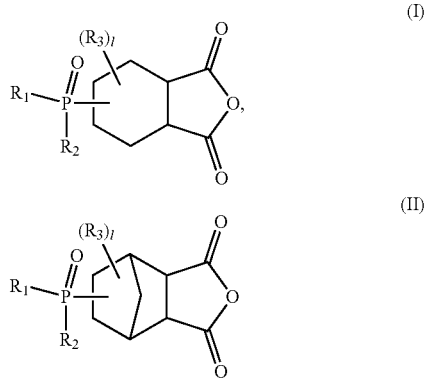

where $R_1$ and $R_2$ are independently alkyl, alkoxy, cycloalkyl, —O-alkyl-cycloalkyl, —O— cycloalkyl, aryl, aryloxy, or $R_1$ and $R_2$ together form a polycyclic moiety, where each aryl or polycyclic moiety is optionally substituted with one or more groups independently selected from alkyl, alkoxy, aryl, aryloxy, arylalkyl, alkenyl, and alkynyl;

$R_3$ is independently alkyl, cycloalkyl, or aryl; where each aryl is optionally substituted with one or more groups independently selected from alkyl, alkoxy, aryl, aryloxy, alkenyl, and alkynyl; and l is 0, 1, 2, 3, 4, 5 or 6;

Also disclosed are methods of making the compounds of Formulas I or II, curable compositions comprising at least one epoxy resin and compounds of Formulas I or II, and cured products made by curing the curable compositions. The compounds of Formulas I and II act as flame retardants, curing agents or both.

DETAILED DESCRIPTION

Embodiments of the present disclosure include a phosphorus-containing epoxy resin that can be used as, among other things, a self-curing compound and/or as a component in a curable composition to form a cured epoxy. The phosphorus-containing epoxy resin of the present disclosure can also be used with other epoxy resins in curable compositions to increase the thermal resistance (e.g., $T_d$ and $T_g$ as discussed herein) of the cured epoxies formed with the other epoxy resins.

The phosphorus-containing epoxy resin of the present disclosure also provides the advantage of being halogen free while acting as a flame retardant for a cured epoxy formed in part with the phosphorus-containing epoxy resin. Such cured epoxies formed with the phosphorus-containing epoxy resin can also have suitable thermal and electrical properties useful for electronic applications including electrical laminates, interconnect substrates, build-up films, solder masks, castings, and adhesives.

Specifically, the phosphorus-containing epoxy resin of the present disclosure can provide improvements in thermomechanical properties, such as increasing the glass transition temperature of the cured epoxy.

The improvements of the present disclosure can include increasing the glass transition temperature ($T_g$) of cured epoxies formed with the phosphorus-containing epoxy resin such that the phosphorus-containing epoxy resin can be used for mid-to-high range applications that undergo temperatures of at least 150° C., and preferably temperatures of at least 170° C. In addition, curable compositions formed with the phosphorus-containing epoxy resin of the present disclosure may also provide, in addition to flame resistance, other desired physical properties, such as thermal resistance. One method for measuring thermal resistance is to measure the thermal decomposition temperature ($T_d$) by determining the temperature at which 5 weight percent (wt %) of a cured epoxy degrades as a sample is heated at a fixed rate.

Phosphorus-containing epoxy resins of the present disclosure can provide cured epoxy resins with $T_d$'s of at least 350° C.

Additionally, the phosphorus-containing epoxy resins of the present disclosure can have a molar ratio of epoxy to phosphorus that can range from 10:1 to 1:1, more preferably from 6:1 to 2:1, and most preferably from 5:1 to 3:1.

As noted above, in a first aspect, disclosed here are compounds of formulas I or II, wherein all variables are as defined above. In one embodiment, the following compounds are not covered by formulas I or II:

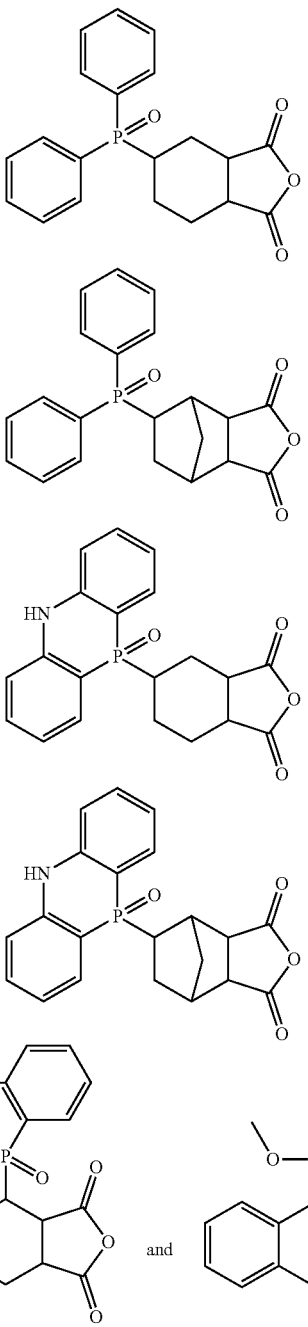

In another embodiment, they are.

In an embodiment, each $R_3$ is independently $C_1$-$C_6$ alkyl, $C_3$-$C_6$ cycloalkyl, or phenyl; where each phenyl is optionally substituted with one or more groups independently selected from $C_1$-$C_6$ alkyl, $C_1$-$C_6$ alkoxy, phenyl, phenyloxy, $C_2$-$C_4$ alkenyl, and $C_2$-$C_4$ alkynyl. In another embodiment, each $R_3$ is independently $C_1$-$C_4$ alkyl, $C_3$-$C_6$ cycloalkyl, or phenyl; where each phenyl is optionally substituted with one or more groups independently selected from $C_1$-$C_4$ alkyl, $C_1$-$C_4$ alkoxy, phenyl, phenyloxy, $C_2$-$C_4$ alkenyl, and $C_2$-$C_4$ alkynyl. In yet another embodiment, each $R_3$ is independently methyl, ethyl, cyclopentyl, cyclohexyl, or phenyl. In still another embodiment, each $R_3$ is independently $C_1$-$C_4$ alkyl. In a further embodiment, each $R_3$ is independently methyl or ethyl. In a still further embodiment, $R_3$ is methyl.

In one alternate embodiment, when l is 1, $R_3$ is methyl, ethyl, cyclopentyl, cyclohexyl, phenyl, allyl, or $C_2$-$C_4$ alkynyl. In another embodiment, $R_3$ is methyl or allyl. In still another alternate embodiment, $R_3$ is methyl.

In another embodiment, $R_1$ and $R_2$ are independently $C_1$-$C_6$ alkyl, $C_1$-$C_6$ alkoxy, $C_3$-$C_6$ cycloalkyl, —O—$C_1$-$C_6$ alkyl-cycloalkyl, —O-cycloalkyl, aryl, aryloxy, or $R_1$ and $R_2$ together form a polycyclic moiety, where each aryl or polycyclic moiety is optionally substituted with one or more groups independently selected from alkyl, alkoxy, aryl, aryloxy, arylalkyl, alkenyl, and alkynyl. In a further embodiment, one of $R_1$ and $R_2$, is methyl, methoxy, cyclopentyl, cyclohexyl, —O—$C_1$-$C_4$ alkoxy-cycloalkyl, —O-cyclopentyl, —O-cyclohexyl, phenyl, phenyloxy, or $R_1$ and $R_2$ together form a polycyclic moiety, where the phenyl, phenyloxy or polycyclic moiety are optionally substituted with one or more groups independently selected from alkyl, alkoxy, aryl, aryloxy, arylalkyl, alkenyl, and alkynyl. In a further embodiment, $R_1$ and $R_2$ are optionally substituted with one or more groups independently selected from $C_1$-$C_6$ alkyl, $C_1$-$C_6$ alkoxy, phenyl, naphthyl, phenyloxy, benzyl, phenethyl, $C_2$-$C_6$ alkenyl, and $C_2$-$C_6$ alkynyl. In a still further embodiment, $R_1$ and $R_2$ are the same. In an alternate embodiment, $R_1$ and $R_2$ are different.

In a different embodiment, $R_1$ and $R_2$ form an optionally substituted polycyclic moiety, where the polycyclic moiety is optionally substituted with one or more groups independently selected from alkyl, alkoxy, aryl, aryloxy, arylalkyl, alkenyl, and alkynyl. In one embodiment, the polycyclic moiety consists of two, optionally substituted, fused rings. In an alternate embodiment, the polycyclic moiety consists of at least three, optionally substituted, fused rings. The polycyclic moiety may comprise one or more heteroatoms, selected from the group consisting of P, N, O, and S. To be clear, the P, N, O, and/or S replace one or more carbons in the polycyclic moiety. In a preferred embodiment, the polycyclic moiety comprises at least one of P, N, O, and S. Preferably, the polycyclic moiety comprises a P. Still more preferably, at least one ring heteroatom within the polycyclic moiety is directly bonded to the P. In a further embodiment, the heteroatom is O or S. In one preferred embodiment, the heteroatom is O.

In an embodiment, the compounds of formulas I or II are compounds of formulas III or IV:

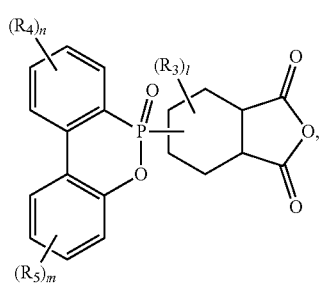

(III)

-continued

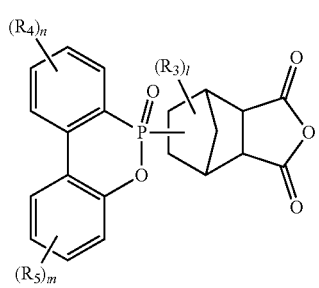

(IV)

wherein l is 0, 1, 2, or 3; m is 0, 1, 2, 3 or 4; and n is 0, 1, 2, 3 or 4; and when at least one of m and n is not 0, each $R_4$ and $R_5$ is independently selected from the group consisting of alkyl, alkoxy, aryl, aryloxy, arylalkyl, alkenyl, and alkynyl. In one embodiment, each $R_4$ and $R_5$ is independently selected from $C_1$-$C_6$ alkyl, $C_1$-$C_6$ alkoxy, phenyl, naphthyl, phenyloxy, benzyl, phenethyl, $C_2$-$C_6$ alkenyl, and $C_2$-$C_6$ alkynyl. In an embodiment, $R_4$ and $R_5$ are the same. Alternatively, they may be different.

In one embodiment, m and n are 0. In a further embodiment, l is also 0.

In one embodiment, l is 0. In another embodiment, l is 1. Is still another embodiment, l is 2. In yet still another embodiment, l is 3. In still yet another embodiment, l is 1 or 2. In each of these embodiments (except when l is 0), each $R_3$ is independently $C_1$-$C_6$ alkyl, $C_3$-$C_6$ cycloalkyl, or phenyl; where each phenyl is optionally substituted with one or more groups independently selected from $C_1$-$C_6$ alkyl, $C_1$-$C_6$ alkoxy, phenyl, phenyloxy, $C_2$-$C_4$ alkenyl, and $C_2$-$C_4$ alkynyl. In another embodiment, each $R_3$ is independently $C_1$-$C_4$ alkyl. In a further embodiment, each $R_3$ is independently methyl or ethyl. In a still further embodiment, $R_3$ is methyl.

In an alternate embodiment, m and n are independently 0, 1 or 2, wherein at least one of m and n is 1 or 2. In such a case, then each $R_4$ and $R_5$ is independently selected from $C_1$-$C_4$ alkyl, $C_1$-$C_4$ alkoxy, phenyl, phenyloxy, benzyl, phenethyl, $C_2$-$C_6$ alkenyl, and $C_2$-$C_6$ alkynyl. In a still further embodiment, each $R_4$ and $R_5$ is independently methyl, ethyl, phenyl, benzyl, phenethyl, methoxy, ethoxy, ethenyl, ethynyl. In an alternate, further embodiment, each $R_4$ and $R_5$ is independently phenyl, phenyloxy, benzyl or phenethyl. In an embodiment, $R_4$ and $R_5$ are the same. Alternatively, they may be different.

In a further embodiment, n is 1 and m is 1. In a further embodiment, $R_4$ and $R_5$ are independently selected from $C_1$-$C_4$ alkyl, $C_1$-$C_4$ alkoxy, phenyl, phenyloxy, benzyl, phenethyl, $C_2$-$C_6$ alkenyl, and $C_2$-$C_6$ alkynyl. In a still further aspect, l is 0 or 1. In a still further embodiment, $R_4$ and $R_5$ are independently methyl, ethyl, phenyl, benzyl, phenethyl, methoxy, ethoxy, ethenyl, ethynyl. In an alternate, further embodiment, $R_4$ and $R_5$ is independently phenyl, phenyloxy, benzyl or phenethyl. In an embodiment, $R_4$ and $R_5$ are the same. Alternatively, they are different.

In another embodiment, n is 1, m is 0. In a further embodiment, $R_4$ is selected from $C_1$-$C_4$ alkyl, $C_1$-$C_4$ alkoxy, phenyl, phenyloxy, benzyl, phenethyl, $C_2$-$C_6$ alkenyl, and $C_2$-$C_6$ alkynyl. In a still further aspect, l is 0 or 1. In a still further embodiment, $R_4$ is methyl, ethyl, phenyl, benzyl, phenethyl, methoxy, ethoxy, ethenyl, ethynyl. In an alternate, $R_4$ is independently phenyl, phenyloxy, benzyl or phenethyl. In still another embodiment, $R_4$ is benzyl.

In another embodiment, m is 1 and n is 0. In a further embodiment, $R_5$ is selected from $C_1$-$C_4$ alkyl, $C_1$-$C_4$ alkoxy, phenyl, phenyloxy, benzyl, phenethyl, $C_2$-$C_6$ alkenyl, and $C_2$-$C_6$ alkynyl. In a still further embodiment, l is 0 or 1. In a still further embodiment, $R_5$ is methyl, ethyl, phenyl, benzyl, phenethyl, methoxy, ethoxy, ethenyl, ethynyl. In an alternate, $R_5$ is independently phenyl, phenyloxy, benzyl or phenethyl. In still another embodiment, $R_5$ is benzyl.

In another aspect, disclosed herein are methods of making the above compounds. The methods include reacting phosphorus compounds of the formulas:

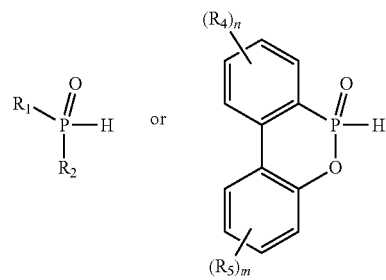

with an olefin compound of the formula:

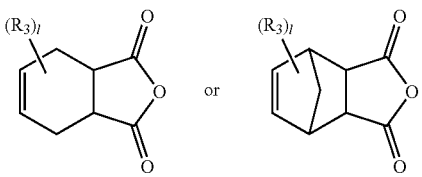

in the presence of a radical initiator at a temperature of about 120° C. to about 160° C.

A variety of free radical initiators may be used, including azo compounds, organic peroxides and inorganic peroxides. Examples of specific free radical initiators include di-tert-butyl peroxide, benzoyl peroxide, peroxydisulfate salts, azobisisobutyronitrile (AIBN), 4,4'-azobis(4-cyanovaleric acid), 1,1'-azobis(cyclohexanecarbonitrile), and 2,2'-azobis (2-methylpropionamidine) dihydrochloride. More than one free radical initiator may be used, simultaneously or sequentially. In an embodiment, the radical initiator comprises an organic peroxide, azobisisobutyronitrile or both. Alternatively, the radical initiator comprises di-tert-butyl peroxide.

The reaction between the phosphorus compound and the olefin compound may occur in the presence or absence of a solvent. Preferably, the reaction is carried out without the presence of water (generally the water is present in less than 5 wt %, more preferable less than 3 wt %, and most preferable less than 1 wt % based on the total weight of the curable composition) because water may tend to react with the phosphorus containing compound and cause foaming. Water can be removed using well-known methods such as heating in a stream of dry air or nitrogen, in a vacuum oven, or by azeotropic removal of water using an organic liquid such as hexane or toluene. This can be done either on the phosphorus compound itself or on the mixture before reaction.

For various embodiments, the reaction between the phosphorus compound and the olefin compound occur in the presence of a solvent. The solvent can be, but is not limited to, toluene, xylene, mesitylene, 2-butanone, 4-methyl-2- pentanone, cyclohexanone, propylene glycol methyl ether acetate (DOWANOL™ PMA), N,N-dimethylformamide (DMF). For various embodiments, the solvent can be used in an amount of from 30 wt % to 60 wt % based on a total weight of the phosphorus compound and the olefin compound.

For various embodiments, the molar ratio of the phosphorus compound to the olefin compound can range from 2:1 to 1:10, more preferably 1:1.

For various embodiments, the weight ratio of the radical initiator to the total reactants can range from 0.01 wt % to 5 wt %, more preferably from 0.5 wt % to 2 wt %.

In one aspect, disclosed herein are curable compositions comprising
a) at least one epoxy resin; and
b) at least one of the phosphorus-olefin adducts of formulas I, II, III or IV.

A variety of epoxy resins may be used to make the curable and cured compositions disclosed herein. Types of epoxy resins that may be used include aromatic epoxy resins, alicyclic epoxy resins, aliphatic epoxy resins, and combinations thereof.

In one embodiment, the at least one epoxy resin is divinylarene dioxide, diglycidyl ethers of bisphenol A, diglycidyl ethers of bromobisphenol A; oligomeric or polymeric diglycidyl ethers of bisphenol A, oligomeric or polymeric diglycidyl ethers of tetrabromobisphenol A, diglycidyl ethers of bisphenol F or their derivatives, epoxy novolac resins, epoxy cresol novolac resins, or mixtures thereof. In an embodiment, the divinylarene dioxide the divinylarene dioxide is selected from the group consisting of substituted divinylbenzene dioxide, divinylnaphthalene dioxide, divinylbiphenyl dioxide, divinyldiphenylether dioxide, and mixtures thereof.

Or the at least one epoxy resin is, glycidyl ether compounds of polyphenols, where the polyphenols are selected from the group consisting of hydroquinone, resorcinol, bisphenol A, bisphenol F, 4,4'-dihydroxybiphenyl, phenol novolac, cresol novolac, trisphenol (tris-(4-hydroxyphenyl) methane), 1,1,2,2-tetra(4-hydroxyphenyl)ethane, tetrabromobisphenol A, 2,2-bis(4-hydroxyphenyl)-1,1,1,3,3,3-hexafluoropropane, 1,6-dihydroxynaphthalene, and combinations thereof.

Examples of alicyclic epoxy resins include polyglycidyl ethers of polyols having at least one alicyclic ring, or compounds including cyclohexene oxide or cyclopentene oxide obtained by epoxidizing compounds including a cyclohexene ring or cyclopentene ring with an oxidizer. Particular examples include, but are not limited to, hydrogenated bisphenol A diglycidyl ether; 3,4-epoxycyclohexyl-methyl-3,4-epoxycyclohexyl carboxylate; 3,4-epoxy-1-methylcyclohexyl-3,4-epoxy-1-methylhexane carboxylate; 6-methyl-3,4-epoxycyclohexylmethyl-6-methyl-3,4-epoxy-cyclohexane carboxylate; 3,4-epoxy-3-methylcyclohexylmethyl-3,4-epoxy-3-methylcyclohexane carboxylate; 3,4-epoxy-5-methylcyclohexylmethyl-3,4-epoxy-5-methylcyclohexane carboxylate; bis(3,4-epoxycyclohexylmethyl)adipate; methylene-bis(3,4-epoxycyclohexane); 2,2-bis(3,4-epoxycyclohexyl)propane; dicyclopentadiene diepoxide; ethylene-bis(3,4-epoxycyclohexane carboxylate); dioctyl epoxyhexahydrophthalate; di-2-ethylhexyl epoxyhexahydrophthalate; and combinations thereof.

Examples of aliphatic epoxy resins include polyglycidyl ethers of aliphatic polyols or alkylene-oxide adducts thereof, polyglycidyl esters of aliphatic long-chain polybasic acids, homopolymers synthesized by vinyl-polymerizing glycidyl acrylate or glycidyl methacrylate, and copolymers synthesized by vinyl-polymerizing glycidyl acrylate or glycidyl methacrylate and other vinyl monomers. Some particular examples include, but are not limited to glycidyl ethers of polyols, such as 1,4-butanediol diglycidyl ether; 1,6-hexanediol diglycidyl ether; a triglycidyl ether of glycerin; a triglycidyl ether of trimethylol propane; a tetraglycidyl ether of sorbitol; a hexaglycidyl ether of dipentaerythritol; a diglycidyl ether of polyethylene glycol; and a diglycidyl ether of polypropylene glycol; polyglycidyl ethers of polyether polyols obtained by adding one type, or two or more types, of alkylene oxide to aliphatic polyols such as propylene glycol, trimethylol propane, and glycerin; diglycidyl esters of aliphatic long-chain dibasic acids; and combinations thereof.

The curable compositions disclosed herein may further contain one or more additional components, which can be either be reactive or non-reactive with the phosphorus-containing epoxy resin of the present disclosure. For the various embodiments, curable compositions formed with the phosphorus-containing epoxy resin and the composition component can be obtained by combining, mixing and then reacting the phosphorus-containing epoxy resin of the present disclosure with the at least one composition component. Examples of such composition components include, but are not limited to, epoxy resins, polyepoxide resins, cyanate esters, dicyanate esters, polycyanate esters, cyanate aromatic esters, maleimide resins, thermoplastics polymers, polyurethanes, polyisocyanates, benzoxazine ring-containing compounds, unsaturated resin systems containing double or triple bonds, and combinations thereof. Further examples of additives include benzoxazine, styrene maleic anhydride copolymer, phenolic novolac, cyanate ester or mixtures thereof.

In an additional embodiment, the curable compositions of the present disclosure can be formed with the phosphorus-containing epoxy resin of the present disclosure and at least one reactive and/or non-reactive thermoplastic resin. Examples of such thermoplastic resins include, but are not limited to, polyphenylene oxide, polyphenylsulfones, polysulfones, polyethersulfones, polyvinylidene fluoride, polyetherimide, polypthalimide, polybenzimidiazole, acrylics, phenoxy, and combinations or blends thereof.

The curable compositions contain about 10 wt % to about 70 wt % of epoxy resin, based on the total weight of the curable composition.

The curable compositions disclosed herein contain about 1 wt % to about 70 wt % phosphorus-containing compound, based on the total weight of the curable composition. Alternatively, the phosphorus-containing epoxy resin of the present disclosure can have a phosphorous content within a range of from 1 wt % to 20 wt %, or 1 wt % to 10 wt %, or more preferably within a range of from 2 wt % to 9 wt %, and most preferably within a range of from 3 wt % to 8 wt %. The embodiments of the present disclosure can also be useful in other applications requiring flame resistant materials, including semiconductor packaging applications, electrical and electronic applications, and composite applications. In addition, the phosphorus-containing epoxy resin is substantially free of both bromine atoms and of halogen atoms.

The curable compositions may further comprise a filler. Examples of fillers include natural silica, fused silica, spherical silica, alumina, hydrated alumina, talc, alumina trihydrate, magnesium hydroxide and combinations thereof.

Electrical laminates may also be prepared from the curable compositions disclosed herein. And printed circuit boards may be prepared from the curable compositions and electrical laminates disclosed herein. If desired, the electrical laminate comprises alternating layers of prepregs and a conductive material.

The curable compositions disclosed herein may further comprise at least one curing agent (also referred to as a "hardener") and/or curing accelerator. Examples of curing agents include anhydrides, carboxylic acids, amine compounds, phenolic compounds, polyols; and mixtures thereof. In one embodiment the composition comprises from about 0.01 weight percent to about 90 weight percent of curing agent. Examples of curing agents include, but are not limited to, dicyandiamide, diaminodiphenylmethane and diaminodiphenylsulfone, polyamides, polyaminoamides, polyphenols, polymeric thiols, polycarboxylic acids, anhydrides such as phthalic anhydride, tetrahydrophthalic anhydride (THPA), methyl tetrahydrophthalic anhydride (MTHPA), hexahydrophthalic anhydride (HHPA), methyl hexahydrophthalic anhydride (MHHPA), nadic methyl anhydride (NMA), polyazealic polyanhydride, succinic anhydride, and maleic anhydride styrene-maleic anhydride copolymers. Phenolic curing agents such as phenol novolacs, cresol novolacs, and bisphenol A novolac may also be used. Curing agents are preferably used in an amount of within a range of from 2 wt % to 80 wt %, based on the total weight of the curable composition.

Curing accelerators (or catalysts) include substituted or epoxy-modified imidazoles such as 2-methylimidazole, 2-phenyl imidazole and 2-ethyl-4-methyl imidazole. Other heterocyclic amines such as 1,8-diazabicyclo[5.4.0]undec-7-ene (also known as DBU) and 1,5-diazabicyclo[4.3.0]non-5-ene (also known as DBN) may also be used. Tertiary amines and phosphines including, but not limited to, triethylamine, tripropylamine, tributylamine, and triphenyl phosphine may also be used. Additionally, phosphonium salts such as ethyltriphenylphosphonium acetate, ethyltriphenylphosphonium acetate and ammonium salts such as benzyltrimethylammonium acetate and benzyltrimethylammonium hydroxide can also be employed as curing accelerators. Halogen salts (iodide, bromide, chloride, and fluoride) are also usable, but are generally less desirable in halogen-free applications. Catalysts are preferably used in an amount of within a range of from about 0.01 wt % to about 2.00 wt %, based on the total weight of the curable composition.

The optimum ratio of the curing agent to the phosphorus-containing epoxy is usually expressed in terms of equivalent ratio. There can be a 1.00:1.00 equivalent ratio of epoxy to reactive hydrogen (—SH, —OH, —NH, or —COOH) or anhydride in the curing agent. The curable compositions of the present disclosure are preferably prepared with an equivalent ratio from 1.20:1.00 to 1.00:1.20, more preferably within a range of from 1.10:1.00 to 1.00:1.10, and most preferably within a range of from 1.10:1.00 to 1.00:1.05.

In another aspect, disclosed herein are processes for preparing a curable epoxy resin composition comprising admixing the curable compositions disclosed herein and at least one curing agent. Also disclosed are cured thermoset products prepared by curing the curable epoxy resin compositions disclosed herein.

Generally, curing the curable composition formed with the phosphorus-containing epoxy resins of Formulas I, II, III and/or IV, in accordance with the disclosure, can be carried out by first melting the phosphorus-containing epoxy resin in the curable composition to obtain a homogeneous melt or dissolving it in a suitable solvent. Examples of suitable solvents include, but are not limited to, ketones such as acetone and/or methyl ethyl ketone, esters, and/or aromatic hydrocarbons. For the embodiments, the solvent can be used in an amount up to about 50 wt % based on the total weight of the curable composition. The solvent can be removed by distillation or simple evaporation during the course of or at the end of the cure.

The phosphorus-containing epoxy resin of the present disclosure can be mixed with thermoplastic resin to form a hybrid crosslink network. Preparation of the curable compositions of the present disclosure can be accomplished by suitable mixing means known in the art, including dry blending the individual components and subsequently melt mixing, either directly in the extruder used to make the finished article or pre-mixing in a separate extruder.

When softened or melted by the application of heat, the curable composition formed with the phosphorus-containing epoxy resin of the present disclosure and the thermoplastic resin can be formed or molded using conventional techniques such as compression molding, injection molding, gas assisted injection molding, calendaring, vacuum forming, thermoforming, extrusion and/or blow molding, alone or in combination. The curable composition formed with the phosphorus-containing epoxy resin of the present disclosure and the thermoplastic resin may also be formed, spun, or drawn into films, fibers, multi-layer laminates or extruded sheets, or can be compounded with one or more organic or inorganic substances.

A Lewis acid may also be employed in the compositions that include an epoxy resin. The Lewis acid may include, for example, one or a mixture of two or more halides, oxides, hydroxides and alkoxides of zinc, tin, titanium, cobalt, manganese, iron, silicon, aluminum, and boron. Examples of such Lewis acids, and anhydrides of Lewis acids include boric acid, metaboric acid, optionally substituted boroxines (such as trimethoxy boroxine, trimethyl boroxine or triethyl boroxine), optionally substituted oxides of boron, alkyl borates, boron halides, zinc halides (such as zinc chloride) and other Lewis acids that tend to have a relatively weak conjugate base.

The phosphorus-containing epoxy resin and/or curable compositions formed with the phosphorus-containing epoxy resin may be useful in the preparation of various articles of manufacture. Thus, the disclosure also includes prepregs of the above composition as well as shaped articles, reinforced compositions, laminates, electrical laminates, coating, molded articles, adhesives, composite products as hereinafter described from cured or partially cured phosphorus-containing epoxy resin or compositions that include the phosphorus-containing epoxy resin of the disclosure. In addition, the compositions of the disclosure can be used for various purposes in the form of a dried powder, pellets, a homogeneous mass, impregnated products and/or compounds.

A variety of additional additives may be added to the curable compositions of the present disclosure. Examples of these additional additives include reinforcement materials, fillers, pigments, dyes, thickening agents, wetting agents, lubricants, flame-retardants and the like. Suitable reinforcing materials include silica, alumina trihydrate, aluminum oxide, aluminum hydroxide oxide, metal oxides, nano tubes, glass fibers, quartz fibers, carbon fibers, boron fibers, Kevlar fibers and Teflon fibers, among others. A size range for the fibrous and/or particulate reinforcing materials can include 0.5 nanometer (nm) to 100 micron (μm). For the various embodiments, the fibrous reinforcing materials can come in the form of a mat, cloth or continuous fibers.

Embodiments of the curable compositions may also include at least one of a synergist to help improve the flame-out ability of the cured composition. Examples of such synergists include, but are not limited to, aluminum hydroxide, magnesium hydroxide, zinc borate, metal phosphinates such as Exolit® OP-930 (available from Clariant), and combinations thereof. In addition, embodiments of the curable compositions may also include adhesion promoters, such as modified organosilanes (epoxidized, methacryl, amino), acetylacetonates, sulfur-containing molecules and combinations thereof. Other additives can include, but are not limited to, wetting and dispersing aids such as modified organosilanes, Byk® 900 series and W 9010 (Byk-Chemie GmbH), modified fluorocarbons and combinations thereof; air release additives such as Byk® A530, Byk® A525, Byk® A555, and Byk® A 560 (Byk-Chemie GmbH); surface modifiers such as slip and gloss additives; mold release agents such as waxes; and other functional additives or prereacted products to improve polymer properties such as isocyanates, isocyanurates, cyanate esters, allyl containing molecules or other ethylenically unsaturated compounds, acrylates and combinations thereof.

For the various embodiments, a resin sheet can be formed from the phosphorus-containing epoxy resin and/or curable compositions of the present disclosure. In one embodiment, a plurality of sheets can be bonded together to form a laminated board, where the sheets comprise at least one of the resin sheet. The phosphorus-containing epoxy resin and/or curable compositions formed with the phosphorus-containing epoxy resin can also be used to form a resin clad metal foil. For example, a metal foil, such as a copper foil, can be coated with the phosphorus-containing epoxy resin and/or curable compositions formed with the phosphorus-containing epoxy resin of the present disclosure.

For the various embodiments, the phosphorus-containing epoxy resin and/or curable compositions of the present disclosure can be applied to a substrate as a coating or adhesive layer. Alternatively, the phosphorus-containing epoxy resin and/or compositions of the present disclosure can be molded or laminated in the form of a powder, a pellet or impregnated in a substrate such as a fibrous reinforcement. The phosphorus-containing epoxy resin and/or curable compositions of the present disclosure can then be cured by the application of heat.

The heat necessary to provide the proper curing conditions can depend on the proportion of composition components constituting the curable composition and the nature of the composition components employed. In general, the curable composition of this disclosure may be cured by heating it at a temperature within the range of about 25° C. to about 250° C., preferably 100° C. to 220° C., although differing according to the presence of a curing agent or its amount, or the types of the composition components in the curable composition. The time required for heating can be 60 seconds to 24 hours, where the exact time will differ according to whether the curable composition is used as a thin coating or as molded articles of relatively large thickness or as laminates or as matrix resins for fiber reinforced composites, particularly for electrical and electronic applications, e.g., when applied to an electrically nonconductive material and subsequently curing the curable composition.

EXAMPLES

Materials

DOPO (9,10-dihydro-9-oxa-10-phosphaphenanthrene-10-oxide), available from Sanko Co., Ltd.

Bz-HCA (8-benzyl-9,10-dihydro-9-oxa-10-phosphaphenanthrene-10-oxide), available from Sanko Co., Ltd.

Methyl Nadic anhydride (MNA), available from Sinopharm Chemical Co.

Methyl tetrahydrophthalic anhydride (MTHPA), available from Sinopharm Chemical Co.

Di-tert-butyl peroxide, available from Sinopharm Chemical Co.

2-Ethyl-4-methyl imidazole (catalyst), available from Sinopharm Chemical Co.

D.E.N.™ 438 (novolac epoxy resin), available from Blue Cube Operation LLC.

EPICLON HP-7200H (novolac epoxy resin), available from DIC.

Benzoxazine, available from Sinopharm Chemical Co.

SMA2000 (styrene maleic anhydride copolymer), available from Cray Valley.

XZ-92741, available from Blue Cube Operation LLC.

KPH-F2003 (phenolic novolac), available from Kolon Industries, Inc.

Test Methods

Preparation of Laminate

Varnish was impregnated onto the 2116 glass cloth. The glass cloth with resin was baked in treater to become partially cured prepreg. Six pieces of prepregs were stacked together and the surface was covered with a sheet of 35 μm standard copper foil. Then the stack was laminated in the hot press at 200° C. for 90 min.

Glass Transition Temperature ($T_g$)

The $T_g$ was measured by Differential Scanning Calorimetry (DSC) on TA Q2000 (from TA Instruments) following IPC-TM650-2.4.25. Typically, a thermal scan ranges from 40° C. to 210° C. and heating rate of 20° C./min was used. Two heating cycles were performed, with the curve from the second cycle used for $T_g$ determination by "half height" method.

Thermal Decomposition Temperature ($T_d$)

The $T_d$ is defined as temperature at 5% weight loss in nitrogen. It was measured on TA Q50 (from TA Instruments) following IPC-TM650-2.4.24.6. The heating rate was 10° C./min.

Time to Delamination at 288° C. (T288)

The T288 was measured on TA Q400 (from TA Instruments) following IPC-TM-2.4.24.1. The time to delamination was determined as the elapsed time from when the temperature reached 288° C. to when a sudden significant dimensional change occurred.

Dielectric Constant ($D_k$)/Dissipation Factor ($D_f$)

The dielectric constant and dissipation factor of the laminate specimen were determined by an Agilent E4991A RF Impedance/Material Analyzer equipped with Agilent 16453A test fixture under 1 GHz at 25° C. following ASTM D-150.

Copper Peel Strength (CPS)

Copper peel strength was measured using an IMASS SP-2000 slip/peel tester equipped with a variable angle peel fixture capable of maintaining the desired 90° peel angle throughout the test. For the copper etching, 2 inches×4 inches copper clad laminates were cut. Two strips of 0.25 inch graphite tape were placed lengthwise along the sample on both faces of the laminate with at least a 0.5 inch space between them.

The laminate pieces were then placed in a KeyPro bench top etcher. Once the samples were removed from the etcher and properly dried, the graphite tape was removed to reveal the copper strips. A razor blade was used to pull up each copper strip. The laminate was then loaded onto the IMASS tester. The copper strip was clamped and the copper peel test was conducted at a 90° angle with a pull rate of 2.8 inch/min.

Press Cooking Test (PCT)

Copper-unclad laminate was cut into 4 pieces with a size of 2 inches×3 inches. The samples were weighted accurately and then put in the autoclave (Thermo Electron Corp. 8000-DSE). The samples were treated under the 121° C. water vapor for 1 hour. The surface water was wiped and the samples were weighted accurately again to calculate the average water uptake.

UL94 Flame Retardancy Test

Each of five specimens (13 cm×12 mm) was ignited twice for 10 seconds in the standard UL94 test chamber (Atlas UL94 Chamber VW-1). The time from leaving the ignition source to self-extinguish was recorded as the burning time. UL94 V-0 rating requires less than 10 seconds of the burning time for each ignition and less than 50 seconds of the total burning time for 10 ignitions.

The following examples are given to illustrate, but not limit, the scope of this disclosure.

Example 1

DOPO (172.50 g) was melted at 140° C. A mixture of MNA (143.55 g) and Di-tert-butyl peroxide (3.74 g) was added slowly into the melted DOPO over 45 min. The mixture were heated at 140~160° C. for 8 h. The final product was a light brown solid at room temperature.

Example 2

DOPO (323.15 g) was melted at 140° C. A mixture of MTHPA (250.68 g) and Di-tert-butyl peroxide (11.08 g) was added slowly into the melted DOPO over 70 min. The mixture were heated at 140~160° C. for 7 h. The final product was a light brown solid at room temperature.

Example 3

Bz-HCA (30.52 g) and MTHPA (16.70 g) were mixed at 160° C. Di-tert-butyl peroxide (0.78 g) was added drop-wise into the reaction mixture. The mixture were heated at 160° C. for 7 h. The final product was a light brown solid at room temperature.

Examples 4-6

Examples 4-6 describe the results obtained when the compounds of Examples 1 and 2 are mixed with an epoxy resin and cured.

The formulations demonstrated a high Tg (>180° C.), which indicated the new phosphorated anhydrides were effective hardeners to cure epoxy.

| Recipe | Inventive example 4 | Inventive example 5 | Inventive example 6 |
|---|---|---|---|
| D.E.N. ™ 438 | 30.5 | 32.2 | \ |
| EPICLON HP-7200H | \ | \ | 41.1 |
| Anhydride (from Example 1) | 69.5 | \ | 58.9 |
| Anhydride (from Example 2) | \ | 67.8 | \ |
| 2E4MI | 0.058 | 0.028 | 0.074 |
| Formulation $T_g$ (° C.) | 190 | 186 | 195 |

Note:
The gel film obtained from the stroke cure was post cured at 200° C. for 1 h; the cured film was then submitted to DSC for $T_g$ measurement.

Examples 7-9

Below table showed the formulation work and the laminate evaluation. The inventive examples 7-9 all achieved V-0 UL94 ranking, indicating phosphorated anhydride could act as an effective flame retardant as XZ-92741 did in the comparative example. The example 7 achieved 0.0074 $D_f$ at 1 GHz, lower than the comparative example, showing that phosphorated anhydride had low $D_f$ advantage over the widely used XZ-92741 when curing with epoxy. The water uptake was high because too much anhydride was used in the formulation. When further modifying the formulation with benzoxazine or SMA, the resulting laminates of examples 8 and 9 showed overall balanced performances, such as high $T_g$, good thermal resistance, good copper peel strength, reasonable water uptake, relatively low $D_f$, compared to the comparative example.

| | Inventive example 7 | Inventive example 8 | Inventive example 9 | Comparative example 1 |
|---|---|---|---|---|
| Recipe | | | | |
| D.E.N. ™ 438 | 32.0 | \ | 36.9 | 47.4 |
| EPICLON HP-7200H | \ | 27.9 | \ | \ |
| Anhydride (from Example 1) | \ | 33.3 | 40.0 | \ |
| Anhydride (from Example 2) | 68.0 | \ | \ | \ |
| XZ-92741 | \ | \ | \ | 33.3 |
| Benzoxazine | \ | 38.8 | \ | \ |
| SMA2000 | \ | \ | 23.1 | \ |
| KPH-F2003 | \ | \ | \ | 19.3 |
| 2E4MI | 0.037 | 0.15 | 0.030 | 0.10 |
| Laminate property | | | | |
| $T_g$ (° C.) | 176 | 181 | 187 | 162 |
| $T_d$ (° C.) | 356 | 371 | 373 | 380 |
| T288 (unclad, min) | >60 | >60 | >60 | >60 |
| Copper peel strength (lb/inch, 1 Oz copper) | | 8.1 | 7.4 | 9.2 |
| Water uptake % (PCT for 1 h) | 1.18% | 0.43% | 0.74% | 0.50% |
| UL94 ranking | V-0 | V-0 | V-0 | V-0 |
| $D_k$ (1 GHz) | 3.54 | 3.61 | 3.55 | 4.0 |
| $D_f$ (1 GHz) | 0.0074 | 0.0066 | 0.0095 | 0.013 |

What is claimed is:

1. A curable composition comprising:
   (a) at least one epoxy resin; and
   (b) at least one compound of formula (III) or formula (IV):

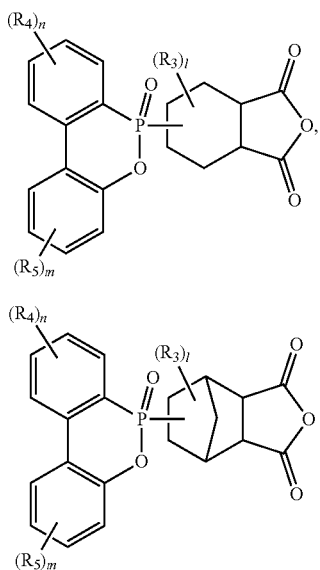

wherein
each $R_3$ is independently selected from the group consisting of $C_1$-$C_4$ alkyl, $C_3$-$C_6$ cycloalkyl, and phenyl; and wherein each phenyl is optionally substituted with one or more groups independently selected from the group consisting of $C_1$-$C_4$ alkyl, $C_1$-$C_1$ alkoxy, phenyl, phenyloxy, alkenyl, and $C_2$-$C_4$ alkynyl;

each $R_4$ and $R_5$ is independently selected from the group consisting of alkyl, alkoxy, aryl, aryloxy, arylalkyl, alkenyl, and alkynyl;

l is 0, 1, 2 or 3;
n is 0, 1, 2, 3 or 4; and
m is 0, 1, 2, 3 or 4.

2. The curable composition of claim 1 wherein m and n are 0.

3. The curable composition of claim 1 wherein m and n are independently 1 or 2.

4. The curable composition of claim 1 wherein each $R_4$ and $R_5$ is independently selected from the group consisting of $C_1$-$C_4$ alkyl, $C_1$-$C_4$ alkoxy, phenyl, phenyloxy, benzyl, $C_2$-$C_6$ alkenyl, and $C_2$-$C_6$ alkynyl; and
   l is 0 or 1.

5. The curable composition of claim 4 wherein each $R_4$ and $R_5$ is independently selected from the group consisting of phenyl, phenyloxy, and benzyl.

6. The curable composition of claim 1 wherein n is 1, and m is 1.

7. The curable composition of claim 4 wherein $R_5$ is benzyl.

8. The curable composition of claim 1 wherein each $R_3$ is independently selected from the group consisting of methyl, ethyl, cyclopentyl, cyclohexyl, and phenyl.

9. A method of preparing a compound of formula (III) or formula (IV),

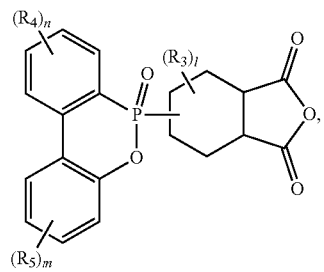

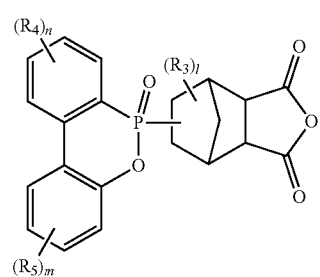

wherein a phosphorus containing compound of the formula:

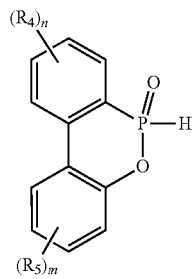

reacts with an olefin compound of the formula:

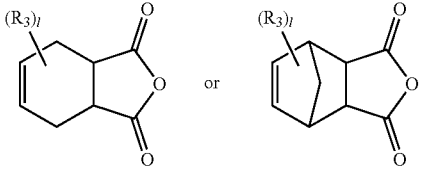

in the presence of a radical initiator at a temperature of from about 120° C. to about 160° C.,
wherein
each $R_3$ is independently selected from the group consisting of $C_1$-$C_4$ alkyl, $C_3$-$C_6$ cycloalkyl, and phenyl; and wherein each phenyl is optionally substituted with one or more groups independently selected from the group consisting of $C_1$-$C_4$ alkyl, $C_1$-$C_4$ alkoxy, phenyl, phenyloxy, $C_2$-$C_4$ alkenyl, and $C_2$-$C_4$ alkynyl; and
each $R_4$ and $R_5$ is independently selected from the group consisting of alkyl, alkoxy, aryl, aryloxy, arylalkyl, alkenyl, and alkynyl; l is 0, 1, 2 or 3; n is 0, 1, 2, 3 or 4; and m is 0, 1, 2, 3 or 4.

10. A method according to claim 9, wherein the radical initiator comprises an organic peroxide, azobisisobutyronitrile or both.

11. A method according to claim 10, wherein the radical initiator comprises di-tert-butyl peroxide.

12. The curable composition of claim 1 wherein the at least one epoxy resin is selected from the group consisting of divinylarene dioxide, diglycidyl ethers of bisphenol A, diglycidyl ethers of bromobisphenol A; oligomeric or polymeric diglycidyl ethers of bisphenol A, oligomeric or polymeric diglycidyl ethers of tetrabromobisphenol A, diglycidyl ethers of bisphenol F or their derivatives, epoxy novolac resins, epoxy cresol novolac resins, and mixtures thereof.

13. The curable composition of claim 1 wherein the at least one epoxy resin comprises one or more glycidyl ether compounds of polyphenols, wherein the polyphenol is selected from the group consisting of hydroquinone, resorcinol, bisphenol A, bisphenol F, 4,4'-dihydroxybiphenyl, phenol novolac, cresol novolac, trisphenol (tris-(4-hydroxyphenyl) methane), 1,1,2,2-tetra (4-hydroxyphenyl) ethane, tetrabromobisphenol A, 2,2-bis (4-hydroxyphenyl)-1,1,1,3,3,3-hexafluoropropane, 1,6-dihydroxynaphthalene, and combinations thereof.

14. The curable composition of claim 1 wherein at least one epoxy resin is an alicyclic epoxy resin selected from the group consisting of polyglycidyl ethers of polyols having at least one alicyclic ring, or compounds including cyclohexene oxide or cyclopentene oxide obtained by epoxidizing compounds including a cyclohexene ring or cyclopentene ring with an oxidizer; or the at least one epoxy resin comprises at least one compound selected from the group consisting of hydrogenated bisphenol A diglycidyl ether; 3,4-epoxycyclohexylmethyl-3,4-epoxycyclohexyl carboxylate; 3,4-epoxy-1-methylcyclohexyl-3,4-epoxy-1-methylhexane carboxylate; 6-methyl-3,4-epoxycyclohexylmethyl-6-methyl-3,4-epoxycyclohexane carboxylate; 3,4-epoxy-3-methylcyclohexylmethyl-3,4-epoxy-3-methylcyclohexane carboxylate; 3,4-epoxy-5-methylcyclohexylmethyl-3,4-epoxy-5-methylcyclohexane carboxylate; bis (3,4-epoxycyclohexylmethyl) adipate; methylene-bis (3,4-epoxycyclohexane); 2,2-bis (3,4-epoxycyclohexyl) propane; dicyclopentadiene diepoxide; ethylene-bis (3,4-epoxycyclohexane carboxylate); dioctyl epoxyhexahydrophthalate; di-2-ethylhexyl epoxyhexahydrophthalate; and combinations thereof.

15. The curable composition of claim 1 wherein at least one epoxy resin is an aliphatic epoxy resin that is selected from the group consisting of polyglycidyl ethers of aliphatic polyols or alkylene-oxide adducts thereof, polyglycidyl esters of aliphatic long-chain polybasic acids, homopolymers synthesized by vinyl-polymerizing glycidyl acrylate or glycidyl methacrylate, and copolymers synthesized by vinyl-polymerizing glycidyl acrylate or glycidyl methacrylate and other vinyl monomers.

16. The curable composition of claim 12, wherein the at least one epoxy resin comprises a divinylarene dioxide selected from the group consisting of substituted divinylbenzene dioxide, divinylnaphthalene dioxide, divinylbiphenyl dioxide, divinyldiphenylether dioxide, and mixtures thereof.

17. The curable composition of claim 1 wherein the composition further comprises benzoxazine, styrene maleic anhydride copolymer, phenolic novolac, cyanate ester or mixtures thereof.

18. The curable composition of claim 1 wherein the epoxy resin is present in an amount in the range of from 1 weight percent to 70 weight percent based on the total weight of the curable composition.

19. The curable composition of claim 1 wherein the phosphorus-containing compound of claim 7 is present in an amount in the range of from 10 weight percent to 70 weight percent based on the total weight of the curable composition.

20. A prepreg prepared from the curable composition of claim 1.

21. An electrical laminate prepared from the curable composition of claim 1.

22. A printed circuit board prepared from the electrical laminate of claim 21.

23. A cured thermoset product prepared by curing the curable epoxy resin composition of claim 1.

* * * * *